(12) United States Patent
Tiller et al.

(10) Patent No.: US 12,362,622 B2
(45) Date of Patent: Jul. 15, 2025

(54) ELECTRIC MOTOR AND PRINTED CIRCUIT BOARD

(71) Applicant: GKN Powder Metallurgy Engineering GmbH, Bonn (DE)

(72) Inventors: Stefan Tiller, Sankt Augustin (DE); Maurice Andree, Neukirchen-Vluyn (DE); Hong Giang To, Düsseldorf (DE)

(73) Assignee: GKN Powder Metallurgy Engineering GmbH, Bonn (DE)

( * ) Notice: Subject to any disclaimer, the term of this patent is extended or adjusted under 35 U.S.C. 154(b) by 132 days.

(21) Appl. No.: 18/009,789

(22) PCT Filed: Jun. 2, 2021

(86) PCT No.: PCT/EP2021/064878
§ 371 (c)(1),
(2) Date: Dec. 12, 2022

(87) PCT Pub. No.: WO2021/249852
PCT Pub. Date: Dec. 16, 2021

(65) Prior Publication Data
US 2023/0223810 A1   Jul. 13, 2023

(30) Foreign Application Priority Data
Jun. 12, 2020 (DE) ..................... 10 2020 115 642.1

(51) Int. Cl.
*H02K 3/52* (2006.01)
*H02K 1/14* (2006.01)
(Continued)

(52) U.S. Cl.
CPC .............. *H02K 3/522* (2013.01); *H02K 1/14* (2013.01); *H02K 11/00* (2013.01); *H05K 1/165* (2013.01);
(Continued)

(58) Field of Classification Search
CPC .......... H02K 3/522; H02K 1/14; H02K 11/00; H02K 2203/03; H05K 1/165; H05K 1/18; H05K 2201/09027; H05K 2201/1009
See application file for complete search history.

(56) References Cited

U.S. PATENT DOCUMENTS 4,007,390 A   2/1977   Muller et al.
4,866,324 A   9/1989   Yuzawa et al.
(Continued)

FOREIGN PATENT DOCUMENTS

CN   104852498 A   8/2015
DE   2435356 C2   11/1983
(Continued)

OTHER PUBLICATIONS

German Patent and Trademark Office, First Examination Report, Application No. 102020115642.1, Feb. 15, 2021, 6 pages [No English Language Translation Available].
(Continued)

*Primary Examiner* — Forrest M Phillips
(74) *Attorney, Agent, or Firm* — Quarles & Brady LLP

(57) ABSTRACT

An electric motor, at least having a stator and an annular rotor which are arranged next to one another along an axial direction; wherein the stator has a plurality of stator teeth which are arranged next to one another along a circumferential direction and which each extend along the axial direction At least one coil has at least one turn is arranged on each stator tooth, wherein the at least one turn is electrically conductively connected to a printed circuit board. The printed circuit board is arranged on an end side of the stator and next to the stator along the axial direction. The printed circuit board comprises a plurality of electrical
(Continued)

connecting lines via which the at least one turn of each coil is connected at least to other turns or to an electrical connection of the motor.

12 Claims, 6 Drawing Sheets

(51) Int. Cl.
    *H02K 11/00*     (2016.01)
    *H05K 1/16*     (2006.01)
    *H05K 1/18*     (2006.01)

(52) U.S. Cl.
    CPC ........... *H05K 1/18* (2013.01); *H02K 2203/03* (2013.01); *H05K 2201/09027* (2013.01); *H05K 2201/1009* (2013.01)

(56) References Cited

U.S. PATENT DOCUMENTS

| | | | |
|---|---|---|---|
| 7,109,625 B1 | 9/2006 | Jore et al. | |
| 8,785,784 B1* | 7/2014 | Duford | H05K 1/0256 174/262 |
| 8,920,143 B2* | 12/2014 | Stolpe | H02K 11/0141 310/85 |
| 11,018,565 B2 | 5/2021 | Post et al. | |
| 2007/0046140 A1 | 3/2007 | Shibukawa et al. | |
| 2010/0158724 A1* | 6/2010 | Ihle | H02K 3/522 310/86 |
| 2013/0043742 A1* | 2/2013 | Jang | H02K 3/522 310/43 |
| 2015/0188375 A1* | 7/2015 | Sullivan | H02K 3/26 310/71 |
| 2018/0048204 A1* | 2/2018 | Sullivan | H02K 3/28 |
| 2019/0058375 A1 | 2/2019 | Tokoi et al. | |
| 2019/0123607 A1* | 4/2019 | Smith | H02K 3/28 |

FOREIGN PATENT DOCUMENTS

| | | |
|---|---|---|
| DE | 102016204445 A1 | 9/2016 |
| DE | 112016003201 T5 | 4/2018 |
| DE | 102019112768 A1 | 11/2019 |
| EP | 3651325 A1 | 5/2020 |
| JP | S5683955 U | 7/1981 |
| JP | S63274347 A | 11/1988 |
| JP | H02206351 A | 8/1990 |
| JP | 2010093872 A | 4/2010 |
| JP | 2017168214 A | 9/2017 |

OTHER PUBLICATIONS

PCT International Search Report and Written Opinion, PCT/EP2021/064878, Sep. 6, 2021, 19 pages.

Japanese Patent Office, Notice of Reasons for Refusal and Search Report, Application No. 2022-576507, Jan. 16, 2024, 34 pages.

* cited by examiner

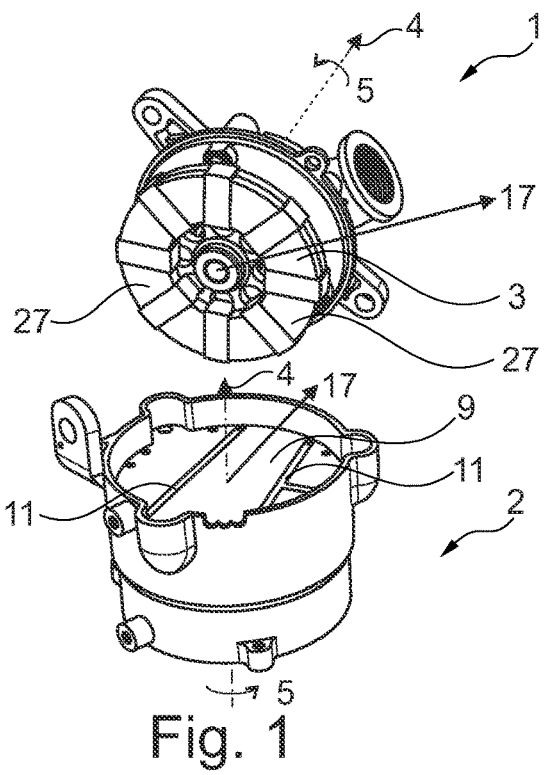
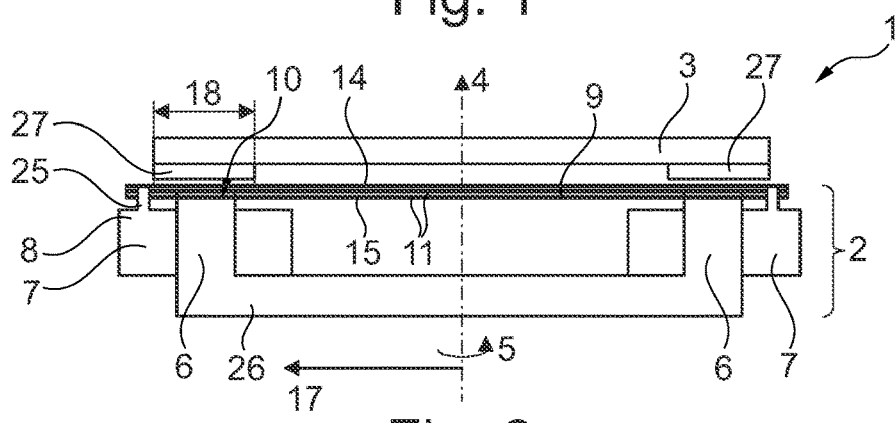
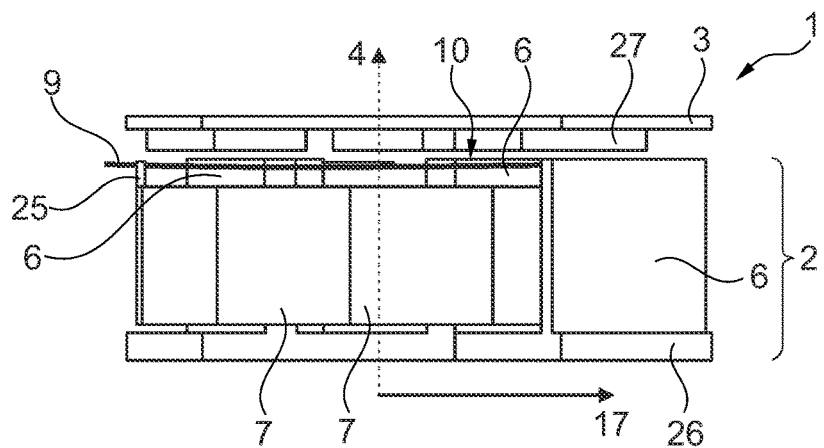
Fig. 1
Fig. 2
Fig. 3

ELECTRIC MOTOR AND PRINTED CIRCUIT BOARD

The present invention relates to an electric motor, wherein the electric motor comprises at least one stator and a rotor. The electric motor is an axial flux motor (AFM). The invention further relates to a printed circuit board for an electric motor.

A stator has a plurality of stator teeth arranged adjacent to one another along a circumferential direction and extending in each case along the axial direction. The motor has a motor winding. The motor winding comprises multiple coils. At least one coil having at least one winding, in particular a plurality of windings, is arranged on each stator tooth.

Electric motors may have printed circuit boards (PCBs), in which electric connecting lines are arranged.

The windings of the coils are connected to the printed circuit board in an electrically conductive manner, wherein the printed circuit board is arranged at an end face of the stator and, along the axial direction, adjacent to the stator.

The electrical interconnection of the individual coils, and of the coils to the electrical connections, is realized via the connecting lines of the printed circuit board. However, the at least one winding, in each case, of each coil, in particular the plurality of windings, may also be connected to one another, or to electrical connections, via the printed circuit boards. The power supply to the windings is realized via the electrical connections.

The connecting lines are routed at least partly in at least one plane transverse to the axial direction in the printed circuit board, wherein each connecting line is associated with an electrical connection and, in each case, at least one stator tooth and is positioned along the axial direction to be at least partly aligned with the coil arranged on the respective stator tooth. The connecting line is routed evenly and in one piece in a section arranged between two mutually adjacent stator teeth and extending along a radial direction.

An axial flux motor is known, for example, from DE 10 2019 112 768 A1.

Electric motors and the design thereof are in constant need of improvement. The improved, for example assembly-friendly and cost-effective, interconnection of the individual coils represents one of the potential improvements here. The use of printed circuit boards or PCBs may be advantageous here, in particular if they may be positioned near to the coils. However, the positioning of the printed circuit board near to the stator entails the risk of magnetic alternating fields acting on the current-carrying conductors and eddy currents being induced in the lines. In particular, when configuring electric motors, the formation of eddy currents during operation of the motor should be taken into account.

Starting with this, the object of the present invention is to propose an electric motor and a printed circuit board which may address these aspects. In particular, the aim is to specify an electric motor and a printed circuit board, in which electric eddy currents, in particular also in the printed circuit board, occur to the least possible extent during operation of the motor.

To achieve these objects, an electric motor according to the features of claim 1 and a printed circuit board according to the features of claim 13 are proposed. Advantageous developments are the subject matter of the dependent claims. The features set out individually in the claims can be combined with one another in a technically meaningful manner and may be supplemented by explanatory substantive matter from the description and details from the figures, whereby further embodiment variants of the invention are demonstrated.

Conducive to this is an electric motor, at least having a stator and an annular motor, which are arranged adjacent to one another along an axial direction. The stator has a plurality of stator teeth arranged adjacent to one another along a circumferential direction and extending in each case along the axial direction. At least one coil having at least one winding, in particular a plurality of windings, is arranged on each stator tooth. The at least one winding (of each coil) is connected to a printed circuit board in an electrically conductive manner, wherein the printed circuit board is arranged at an end face of the stator and, along the axial direction, adjacent to the stator (and, in this case, possibly at least partly overlapping the stator teeth). The printed circuit board comprises a plurality of electric connecting lines, via which the at least one winding of each coil is connected at least to other windings or to an electrical connection of the electric motor. These connecting lines are routed at least partly in at least one plane transverse to the axial direction in the printed circuit board. Each connecting line is associated with an electrical connection and, in each case, at least one stator tooth. At least one section of at least one connecting line is split into a plurality of sub-lines, wherein the sub-lines in the section are arranged to be electrically insulated from one another.

In an axial flux motor, the stator and rotor are arranged adjacent to one another along the axial direction, wherein the rotor has magnets or poles, which are arranged opposite the coils or stator teeth along the axial direction and are possibly aligned, at least along the axial direction (i.e. they are arranged on a same diameter, for example). The stator has stator teeth and coils, which extend along the axial direction starting from an annular base body (yoke). The number of coils or stator teeth and the number of poles of the rotor (for example magnets or permanent magnets) may differ from one another or correspond to one another.

In an axial flux motor, a substantially axially oriented component of the magnetic flux generated by the stator is used to drive the rotor.

The stator of the electric motor comprises, in particular, a soft magnetic material, for example a so-called soft magnetic composite (SMC), or a combination of electric sheets and an SMC. The stator teeth are preferably produced from a soft magnetic material by pressing and cementing. The SMC material is not sintered here. Instead, temperature control to below melting temperature is realized, which is, however, sufficient for the cores to permanently retain their geometry.

The respective rotor has, in particular, permanent magnets and/or soft magnetic elements, for example in recesses. A permanently excited synchronous or brushless direct current motor, abbreviated as BLDC, may preferably be formed using permanent magnets, whilst a reluctance motor as an electric motor may be created using soft magnetic elements, for example.

The respective rotor may alternatively be designed as a cage or squirrel-cage rotor or as a slip ring rotor, wherein an asynchronous machine is then formed.

In particular, the rotor is produced at least partly using a sintering technique. In particular, complex structures on the rotor can be formed very easily using a sintering technique.

The motor has electrical connections, via which an electric current may be applied in particular to the stator or the coils. In particular, a multi-phase current, preferably a three-phase current is applied to the motor. The motor is then at least temporarily connected to a phase via each connection. The coils or windings arranged on a stator tooth are associated with a phase in each case or simultaneously connected to the same connection in each case.

Starting with the connections, the power is supplied to interfaces, via which the connections are connected to the coils in an electrically conductive manner.

The electrically conductive connection of the interfaces is realized via the printed circuit board or the connecting lines formed in the printed circuit board.

The connecting lines are formed in the printed circuit board (PCB) in particular via a printing process. This typically produces flat structures, which have a small extent in the axial direction, but a significantly greater extent in the radial direction and in the circumferential direction, for example. The connecting lines are bordered by an electrically insulating material of the printed circuit board, for example a plastic or resin, along their extent.

In the present case, it is proposed that the connecting lines routed in the printed circuit board be at least partly designed in a particularly advantageous manner. The particular configuration of the connecting lines is intended to be conducive to reducing, in particular significantly reducing, the formation of eddy currents.

The connecting lines are routed at least partly in at least one plane, possibly multiple planes, transverse to the axial direction in the printed circuit board. The planes are spaced from one another along the axial direction or arranged offset from one another at least along the axial direction.

Each connecting line is associated with an electrical connection or a phase of a multi-phase current and in each case at least (or precisely) one stator tooth (or the at least one coil arranged on this stator tooth).

The connecting lines may be positioned along the axial direction to be at least partly aligned with the coils arranged on the respective stator tooth. Contacting of the individual coils or the individual windings by the connecting line associated with these coils is therefore (particularly easily) possible. The contacting is realized in particular via axially routed lines, which extend from the winding and at least partly along the axial direction to the printed circuit board.

Contact lines extend in particular along the axial direction in the printed circuit board, wherein the contact lines connect individual connecting lines arranged on different planes of the printed circuit board to one another.

As a result of the connecting line being at least partly aligned with the coil, the stator teeth may extend at least into the printed circuit board or along the axial direction and through the printed circuit board. The printed circuit board has, in particular, corresponding openings or orifices for the stator teeth.

It is proposed to split at least one section of at least one connecting line into a plurality of sub-lines, wherein the sub-lines are arranged to be electrically insulated from one another (only) in the section, (for example via the above-mentioned material of the printed circuit board).

The sub-lines of a connecting line are electrically connected in parallel with one another, i.e. commonly associated with a phase of a multi-phase current, for example. The splitting of the connecting line into a plurality of sub-lines, at least in the section, results in a significant reduction in the eddy current losses during operation of the motor.

In particular, the printed circuit board is arranged between the stator and the rotor along the axial direction. It is specifically in this configuration of a motor, which is chosen based on assembly conditions, for example, that the eddy current losses may be significantly reduced as a result of splitting the connecting line into sub-lines, at least in the section. The printed circuit board may be used to support the stator and to absorb the axial forces exerted on the stator by the rotor and to divert them into the housing, for example as a result of a positive fit between the printed circuit board and the motor housing.

In particular, the rotor has a plurality of magnets. The section is arranged at least within a region of the printed circuit board with which the magnets can be aligned along the axial direction during operation of the motor.

During operation of the motor, the magnets of the rotor move in particular along a circular path with respect to the rotor, wherein the magnets only move within an annular region of the printed circuit board which is aligned with the magnets along the axial direction.

It is specifically in this region that the strongest eddy currents occur, and these may be at least reduced by splitting the connecting line into sub-lines.

In particular, at least one sub-line, preferably all sub-lines which extend along a routing direction between a first end and a second end, has a width extending transversely to the routing direction (and transversely to the axial direction, i.e. in the circumferential direction and/or in the radial direction) of maximally 1.5 millimeters, preferably maximally 1.0 millimeter, particularly preferably maximally 0.5 millimeters or even maximally 0.2 millimeters.

In particular, a height of the sub-line and/or connecting line in the printed circuit board which extends along the axial direction is maximally 1.0 millimeter, in particular maximally 0.5 millimeters, particularly preferably 0.3 millimeters or even maximally 0.2 millimeters.

In particular, the sub-lines associated with the different connecting lines are routed at least partly in mutually different planes in the printed circuit board, which planes are at least offset from one another in the axial direction.

In particular, at least the connecting lines or sub-lines arranged in mutually different planes are connected to one another in an electrically conductive manner via contact lines extending along the axial direction in the printed circuit board. The contact lines have a line cross section which is maximally 100%, in particular maximally 80%, preferably maximally 50% of a line cross section of the sub-line connected to the respective contact line.

In particular, at least some of the sub-lines in the at least one section of a connecting line are routed in mutually different planes in the printed circuit board, which planes are at least offset from one another in the axial direction.

In particular, the sub-lines are mutually connected to other sub-lines of the connecting line in an electrically conductive manner exclusively outside the section.

In particular, the sub-lines are connected to other sub-lines or other connecting lines or to another connecting line in an electrically conductive manner exclusively outside the section via contact lines.

In particular, the at least one connecting line extends from a first interface to one of the connections and at least partly around the stator tooth to a second interface, wherein the connecting line is also split into sub-lines outside the section.

In particular, the connecting line is split into sub-lines, or designed in the form of sub-lines, along its entire extent in the printed circuit board. In particular, only an end or only both ends of the connecting line are united in an electrically conductive manner and moreover connected to (in each case) one interface.

In particular each sub-line extends exclusively along a plane in the printed circuit board.

In particular, the at least one connecting line in the section is split into at least three sub-lines, preferably into at least four, particularly preferably into at least 5 or 6 or even more sub-lines.

The contact line may have a round, for example a circular or oval, line cross section.

In particular, the contact line has a non-round line cross section. The contact line preferably has, for example, an angular, preferably rectangular, line cross section.

In particular, an extent of the line cross section of the contact line parallel to the routing of the winding and/or the sub-line is greater than an extent transverse thereto.

A printed circuit board for an electric motor, in particular for the described electric motor, is further proposed.

The motor has at least one stator and an annular rotor, which are arranged adjacent to one another along an axial direction. The stator has a plurality of stator teeth arranged adjacent to one another along a circumferential direction and extending in each case along the axial direction. At least one coil having at least one winding, in particular a plurality of windings, is arranged on each stator tooth. The at least one winding (of each coil) can be connected to the printed circuit board in an electrically conductive manner, wherein the printed circuit board can be arranged at an end face of the stator and, along the axial direction, adjacent to the stator (and, in this case, possibly at least partly overlapping the stator teeth).

The printed circuit board comprises a plurality of electric connecting lines, via which the at least one winding of each coil is connected at least to other windings or to at least one electrical connection of the electric motor. These connecting lines are routed at least partly in at least one plane transverse to the axial direction in the printed circuit board. Each connecting line is associated with an electrical connection and, in each case, at least one stator tooth. At least one section of at least one connecting line is split into a plurality of sub-lines, wherein the sub-lines in the section are arranged to be electrically insulated from one another.

The statements relating to the motor are, in particular, equally transferable to the printed circuit board, and vice versa.

The use of indefinite articles ("a" and "an"), in particular in the claims and the description reproducing them should be understood as such and not in a numerical sense. Accordingly, terms or components introduced thereby should be understood such that they are present at least once but may, in particular, also be present in multiples.

For the avoidance of doubt, the numbers ("first", "second", "third", . . . ) used here primarily serve (only) to differentiate between multiple similar objects, sizes or processes; i.e., in particular, they do not necessarily specify a mutual dependency and/or sequence of these objects, sizes or processes. Should a dependency and/or sequence be necessary, this is explicitly stated here or it is evident to a person skilled in the when studying the specifically described configuration.

The invention and the technical environment are explained in more detail below with reference to the figures. It should be noted that the invention shall not be restricted by the exemplary embodiments shown. In particular, unless explicitly stated otherwise, it is also possible to extract partial aspects of the substantive matter explained in the figures and to combine them with other components and findings from the present description and/or figures. The same reference signs denote the same objects, so explanations from other figures may be used in a supplementary manner, if necessary. In a schematic illustration:

FIG. 1 shows part of an electric motor in a perspective view;

FIG. 2 shows the electric motor according to FIG. 1 in a side view in section;

FIG. 3 shows the electric motor according to FIGS. 1 and 2 in a side view in section;

Figure 4:
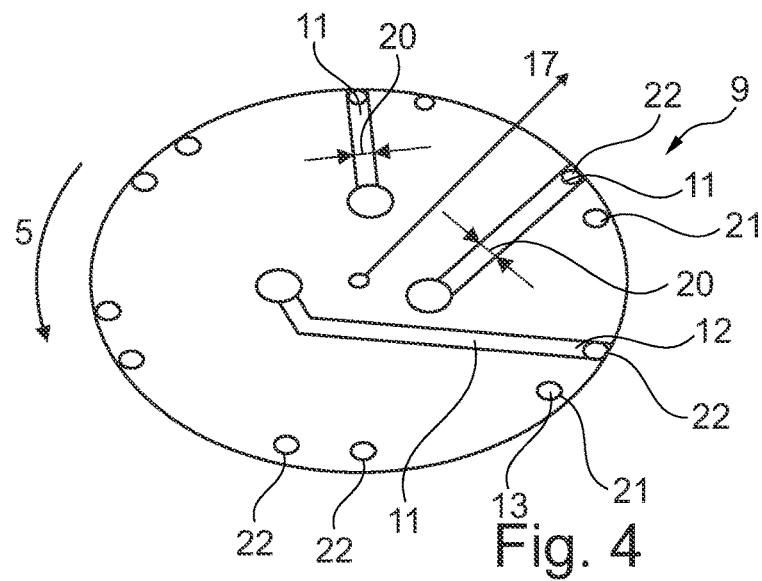
FIG. 4 shows a known printed circuit board for an electric motor in a plan view in section.
Figure 5:
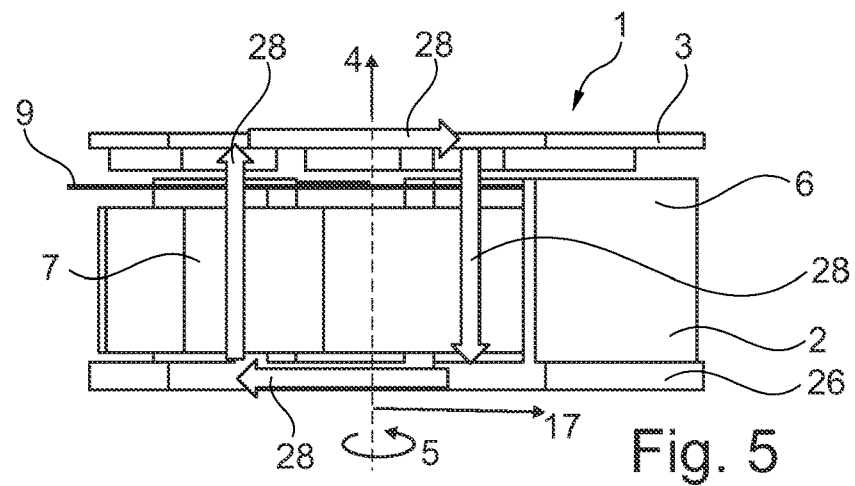
FIG. 5 shows the electric motor according to FIGS. 1 to 3 in a side view in section.
Figure 6:
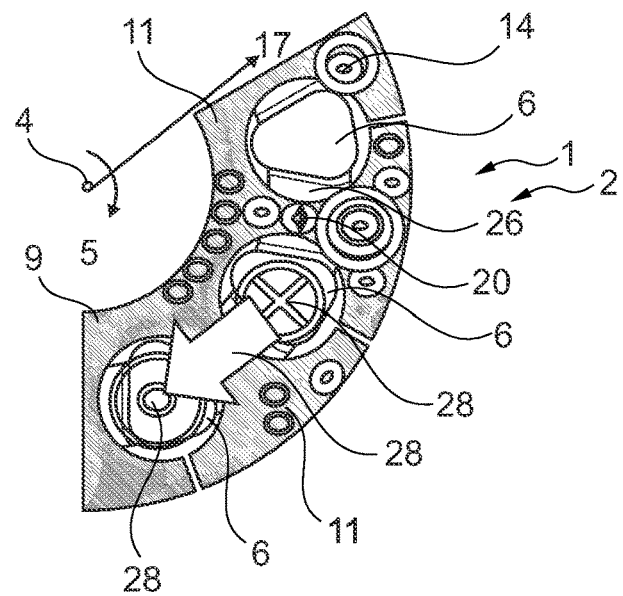
FIG. 6 shows a motor having the printed circuit board according to FIG. 4 in a plan view in section.

FIG. 1 shows part of an electric motor 1 in a perspective view. FIG. 2 shows the electric motor 1 according to FIG. 1 in a side view in section. FIG. 3 shows the electric motor 1 according to FIGS. 1 and 2 in a side view in section. FIG. 4 shows a known printed circuit board 9 for an electric motor 1 in a plan view in section. FIG. 5 shows the electric motor 1 according to FIGS. 1 to 3 during operation in a side view in section. FIG. 6 shows a motor 1 having the printed circuit board 9 according to FIG. 4 in a plan view in section. FIGS. 1 to 6 are described together below.

The motor 1 has a stator 3 and an annular rotor 2, which are arranged adjacent to one another along an axial direction 4. The stator 3 has a plurality of stator teeth 6 arranged adjacent to one another along a circumferential direction 5 and extending in each case along the axial direction 4. A coil 7 having at least one winding 8 or a plurality of windings 8 is arranged on each stator tooth 6. The windings 8 are connected to a printed circuit board 9 in an electrically conductive manner, wherein the printed circuit board 9 is arranged at an end face 10 of the stator 2 and, along the axial direction 4, adjacent to the stator 2. The printed circuit board 9 comprises a plurality of electric connecting lines 11, via which the windings 8 are connected to one another and to electrical connections 12, 13 of the electric motor 1. These connecting lines 11 are routed at least partly in multiple planes 14, 15, 16 transverse to the axial direction 4 in the printed circuit board 9 (according to FIG. 2, for example, in a first plane 14 and a second plane 15). Each connecting line 11 is associated with an electrical connection 12, 13 and, in each case, at least one stator tooth 6 and is positioned along the axial direction to be at least partly aligned with the coil 7 arranged on the respective stator tooth 6 (see FIG. 4).

In the printed circuit board 9, the connecting lines 11 are designed as flat structures (see FIG. 4), which have a small extent in the axial direction 4 (see FIGS. 2 and 3) but a significantly greater extent in the radial direction 17 and in the circumferential direction 5. The connecting lines 11 are bordered by electrically insulating material of the printed circuit board 9, for example a plastic or resin, along their extent.

In an axial flux motor 1, a substantially axially 4 oriented component of the magnetic flux 28 generated by the stator 2 is used to drive the rotor (see FIG. 5).

FIG. 6 shows that, in a known printed circuit board 9 having connecting lines 11 with a large width 20, locally strong eddy currents or eddy current losses occur.

Figure 7:
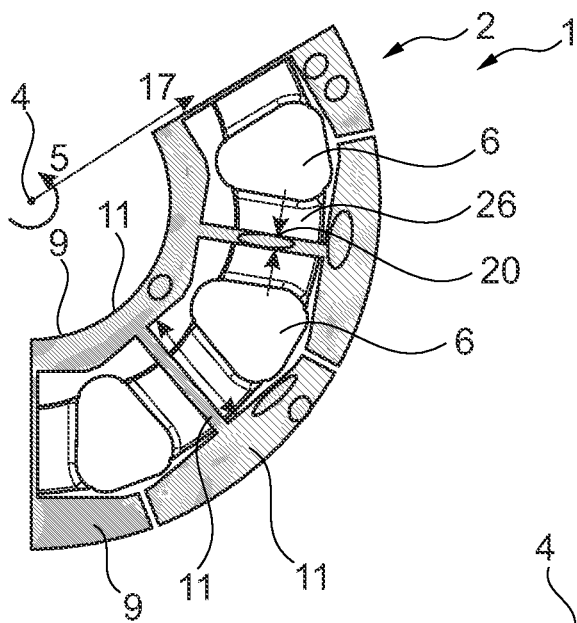
FIG. 7 shows a motor having another printed circuit board in a plan view in section.

FIG. 7 shows a motor 1 having another printed circuit board 9 in a plan view in section. Reference is made to the embodiments relating to FIGS. 1 to 6.

The connecting line 11 in a section 18 is designed with a small width 20 here. Although the eddy current losses may therefore be reduced, the resistance of the connecting line 11 in the section 18 is now significantly increased.

Figure 8:
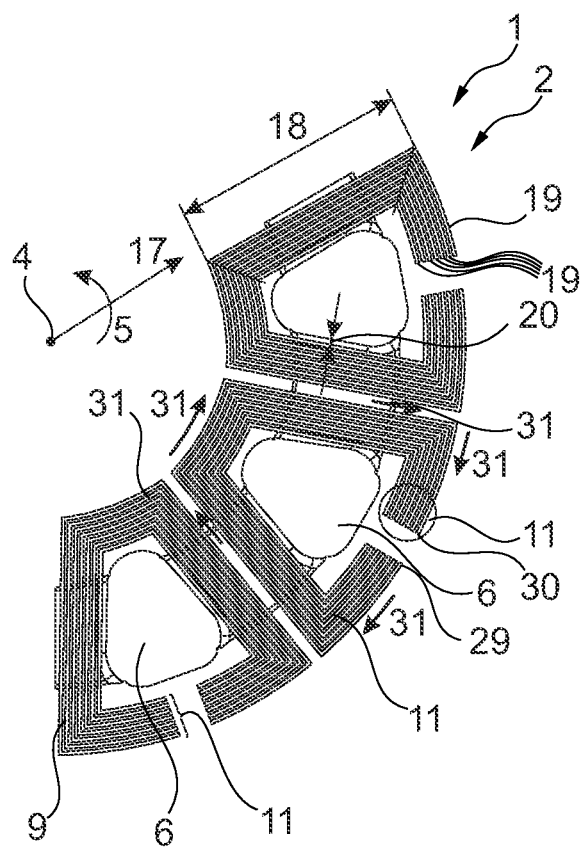
FIG. 8 shows a motor having a printed circuit board in a plan view in section.
Figure 9:
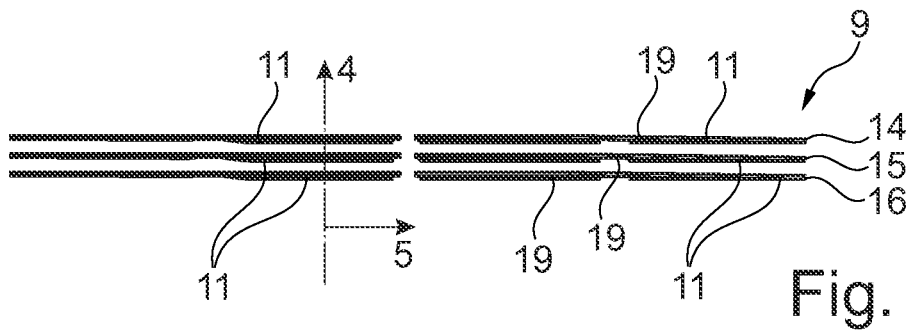
FIG. 9 shows the printed circuit board of the motor according to FIG. 8 in a side view in section.
Figure 10:
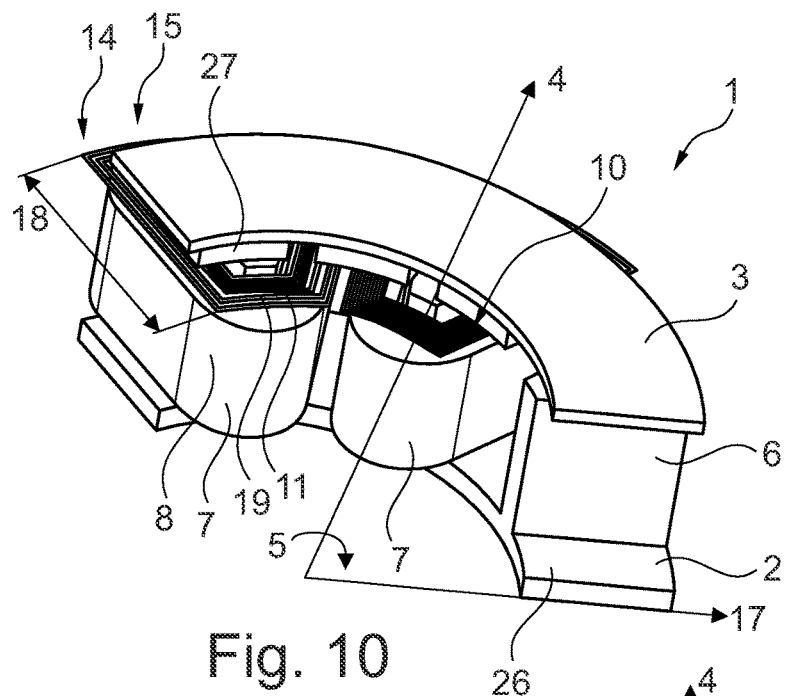
FIG. 10 shows the motor according to FIG. 8 in a first perspective view.
Figure 11:
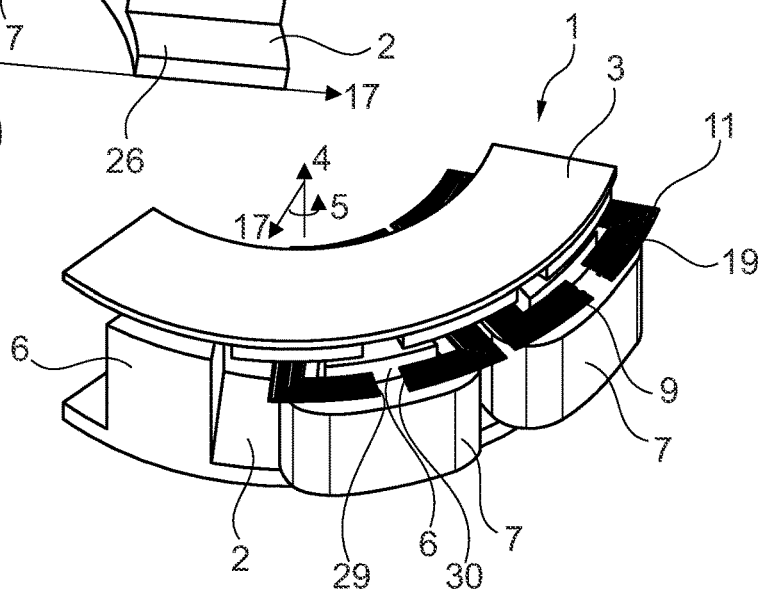
FIG. 11 shows the motor according to FIG. 8 in a second perspective view.
Figure 12:
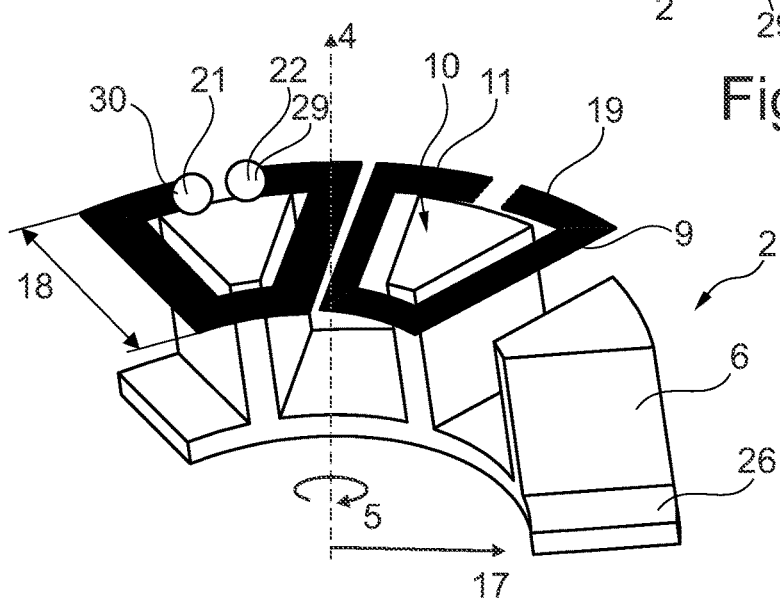
FIG. 12 shows the stator of motor according to FIG. 8 in a perspective view.
Figure 13:
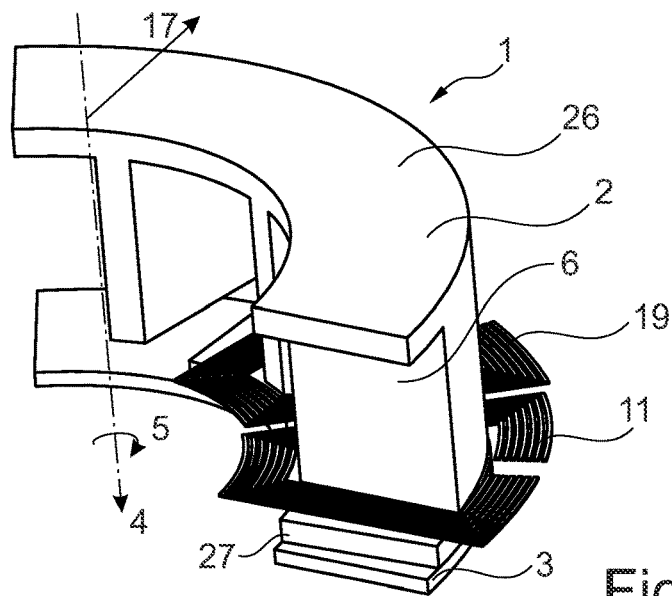
FIG. 13 shows the motor according to FIG. 8 in a third perspective view.
Figure 14:
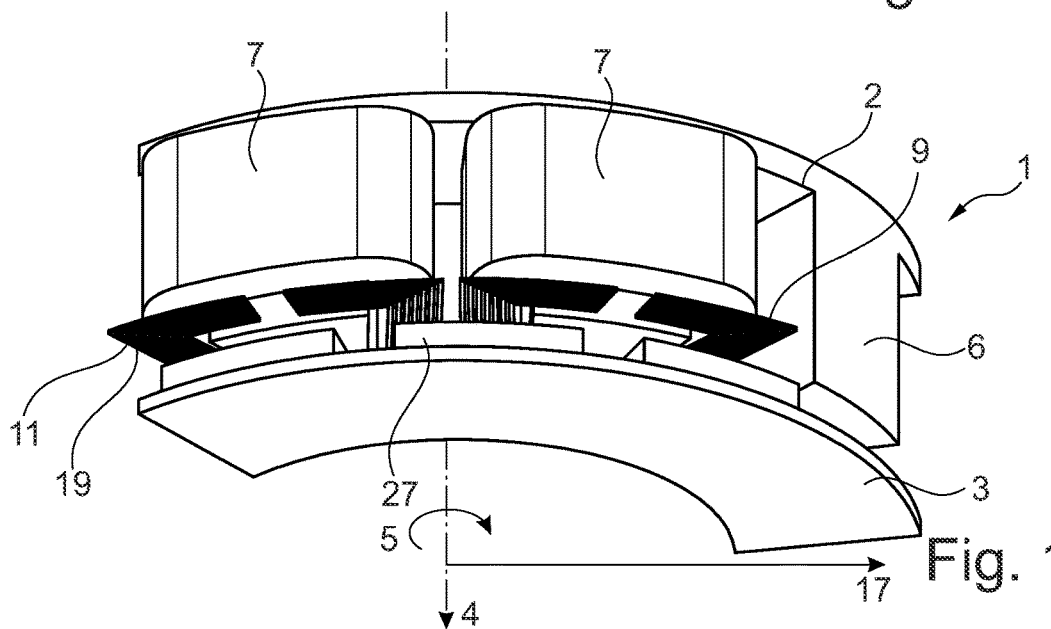
FIG. 14 shows the motor according to FIG. 8 in a fourth perspective view.
Figure 15:
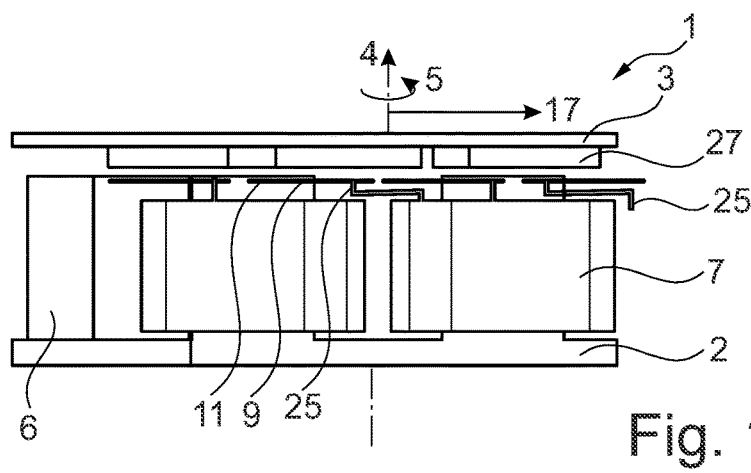
FIG. 15 shows the motor according to FIG. 8 in a side view in section.

FIG. 8 shows a motor 1 having a printed circuit board 9 in a plan view in section. FIG. 9 shows the printed circuit board 9 of the motor 1 according to FIG. 8 in a side view in section. FIG. 10 shows the motor 1 according to FIG. 8 in a first perspective view. FIG. 11 shows the motor 1 according to FIG. 8 in a second perspective view. FIG. 12 shows the stator 2 of the motor 1 according to FIG. 8 in a perspective view. FIG. 13 shows the motor 1 according to FIG. 8 in a third perspective view. FIG. 14 shows the motor 1 according to FIG. 8 in a fourth perspective view. FIG. 15 shows the motor 1 according to FIG. 8 in a side view in section. FIGS. 8 to 15 are described together below. Reference is made to the embodiments relating to FIGS. 1 to 7.

The motor 1 has a stator 3 and an annular rotor 2, which are arranged adjacent to one another along an axial direction 4. The stator 3 has a plurality of stator teeth 6 arranged adjacent to one another along a circumferential direction 5 and extending in each case along the axial direction 4. A coil 7 having a plurality of windings 8 is arranged on each stator tooth 6. The windings 8 are connected to the printed circuit board 9 in an electrically conductive manner, wherein the printed circuit board 9 is arranged at an end face 10 of the stator 2 and, along the axial direction 4, adjacent to (or overlapping) the stator 2. The printed circuit board 9 comprises a plurality of electric connecting lines 11, via which the windings 8 are connected to one another and to electrical connections 12, 13 of the electric motor 1. These connecting lines 11 are routed in multiple planes 14, 15, 16 (according to FIG. 9, for example, in a first plane 14, a second plane 15 and a third plane 16) transverse to the axial direction 4 in the printed circuit board 9. Each connecting line 11 is associated with an electrical connection 12, 13 and, in each case, at least one stator tooth 6 and is positioned along the axial direction 4 to be at least partly aligned with the coil 7 arranged on the respective stator tooth 6 (see FIGS. 10 to 15).

A section 18 of a connecting line 11 which is arranged between two mutually adjacent stator teeth 6 and extends along a radial direction 18 and with which the magnets 27 of the rotor 3 are aligned along the axial direction 4 during operation 2 of the motor 1 is split into a plurality of sub-lines 19, wherein the sub-lines 19 in the section 18 are arranged to be electrically insulated from one another. In FIGS. 8 to 15, the sub-lines 19 extend between a first end 29 and a second end 30 along a routing direction 31 extending transversely to the axial direction 4. In this case, the connecting line 11 is split into sub-lines 19 over its entire extent.

The stator 2 has stator teeth 6 and coils 7, which extend along the axial direction 4 starting from an annular base body 26 (yoke or stator iron or stator back iron). The number of coils 7 or stator teeth 6 and the number of magnets 27 of the rotor 3 may differ from one another or correspond to one another.

Each connecting line 11 is associated with an electrical connection 12, 13 and, in each case, at least one stator tooth 6 and is positioned along the axial direction to be at least partly aligned with the coil 7 arranged on the respective stator tooth 6. Contacting of the individual windings 8 of a coil 7 by the connecting line 11 associated with this coil 7 is therefore possible. The contacting is realized via lines 25 (see, for example, FIG. 15), which extend from the winding 8 and at least partly along the axial direction 4 to the printed circuit board 9. The lines 25 of the contact lines 23 connecting the connecting lines 11 to one another extend along the axial direction 4 in the printed circuit board 9.

As a result of the connecting line 11 being at least partly aligned with the coil 7, the stator teeth 6 may extend at least into the printed circuit board 9 or along the axial direction 4 and through the printed circuit board. The printed circuit board 9 has openings or orifices for the stator teeth 6.

The section 18 of the connecting lines 11 is split into a plurality of sub-lines 19 (six sub-lines here), wherein the sub-lines 19 in the section 18 are arranged to be electrically insulated from one another (for example by the above-mentioned material of the printed circuit board 9).

The printed circuit board 9 is arranged between the stator 2 and the rotor 3 along the axial direction 4. It is specifically in this configuration of a motor 1, which is selected based on assembly conditions, for example, that the eddy current losses may be significantly reduced as a result of splitting the connecting line 11 in the section 18 into sub-lines 19.

The sub-lines 19 have a significantly reduced width 20 extending transversely to a routing direction 31 of the sub-line 19 (see for example FIG. 8).

The sub-lines 19 are mutually connected to other sub-lines 19 of the connecting line 11 in an electrically conductive manner exclusively outside the section (see for example FIG. 12).

The connecting lines 11 extend from a first interface 21 to one of the connections 12, 13 and at least partly around the stator tooth 6 to a second interface 22, wherein the connecting line 11 is also split into sub-lines 19 outside the section 18. In FIGS. 8 and 10 to 15, the connecting line 11 is designed entirely in the form of sub-lines 19, wherein, in FIG. 12, only both ends of the connecting line 11 or the ends 29, 30 of the sub-lines 19 are united in an electrically conductive manner and are moreover connected to (in each case) one interface 21, 22.

Each sub-line 19 extends exclusively along a plane 14, 15, 16 in the printed circuit board 9.

The plurality of windings 8 of a coil 7 are connected to the connecting line 11 and thereby at least partly to the sub-lines 19 in an electrically conductive manner via lines 25 extending along the axial direction 4 in the printed circuit board 9. The sub-lines 19 are connected to one another within the printed circuit board 9 via contact lines 23 extending in the axial direction 4.

Figure 16:
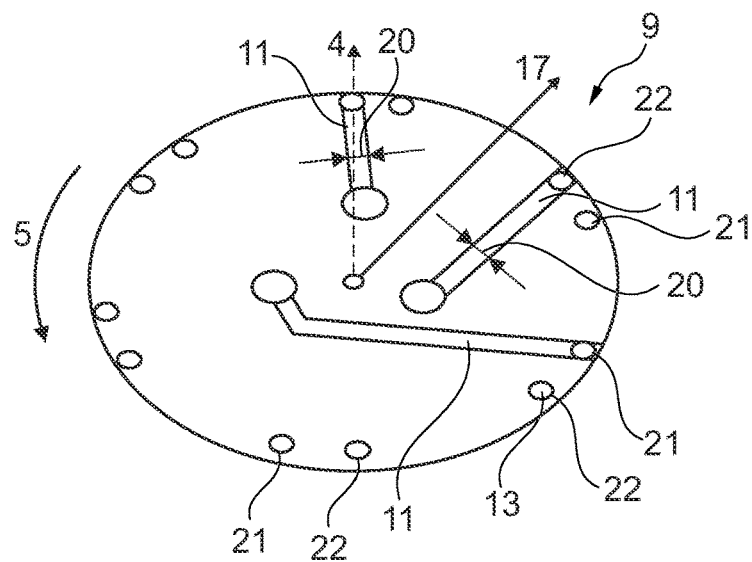
FIG. 16 shows the known printed circuit board according to FIG. 4 in a plan view in section.
Figures 17, 18:
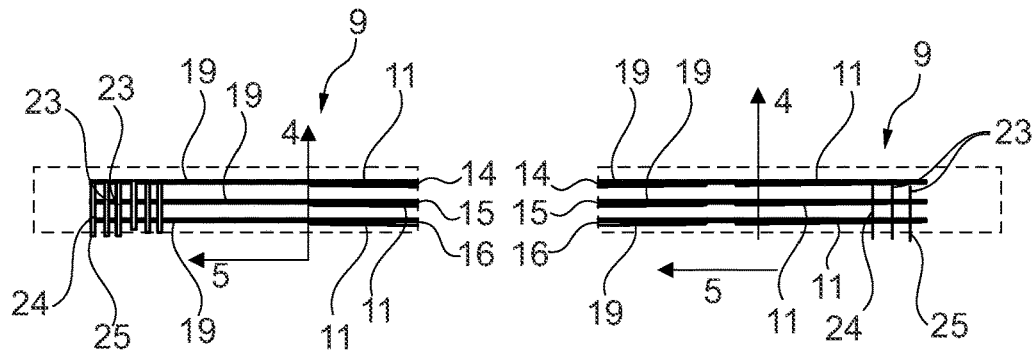
FIG. 17 shows the printed circuit board according to FIG. 16 in a first embodiment variant in a side view in section.
FIG. 18 shows the printed circuit board according to FIG. 9 in a second embodiment variant.

FIG. 16 shows the known printed circuit board 9 according to FIG. 4 in a plan view in section. FIG. 17 shows the printed circuit board 9 according to FIG. 16 in a first embodiment variant in a side view in section. FIG. 18 shows the printed circuit board 9 according to FIG. 9 in a second variant embodiment. FIG. 1 shows a detail of the printed circuit board 9 according to FIG. 9 in a plan view in section and in a side view in section. FIGS. 16 to 19 are described together below. Reference is made to the embodiments relating to FIGS. 1 to 15.

In the known printed circuit board 9, the connecting lines 11 are designed as flat structures (see FIG. 16), which have a small extent in the axial direction 4 (see FIG. 17) but a significantly greater extent in the radial direction 17 and in the circumferential direction 5.

The contact lines 23 of the proposed printed circuit board 9 have a line cross section 24 (in the plane transverse to the axial direction 4 here), which is maximally 100% of a line cross section 24 of the sub-line 19 connected to the respective contact line 23.

The contact line 23 and possibly the line 25 may have a round, for example a circular or oval, line cross section 24 (see FIGS. 16 to 18).

Figure 19:
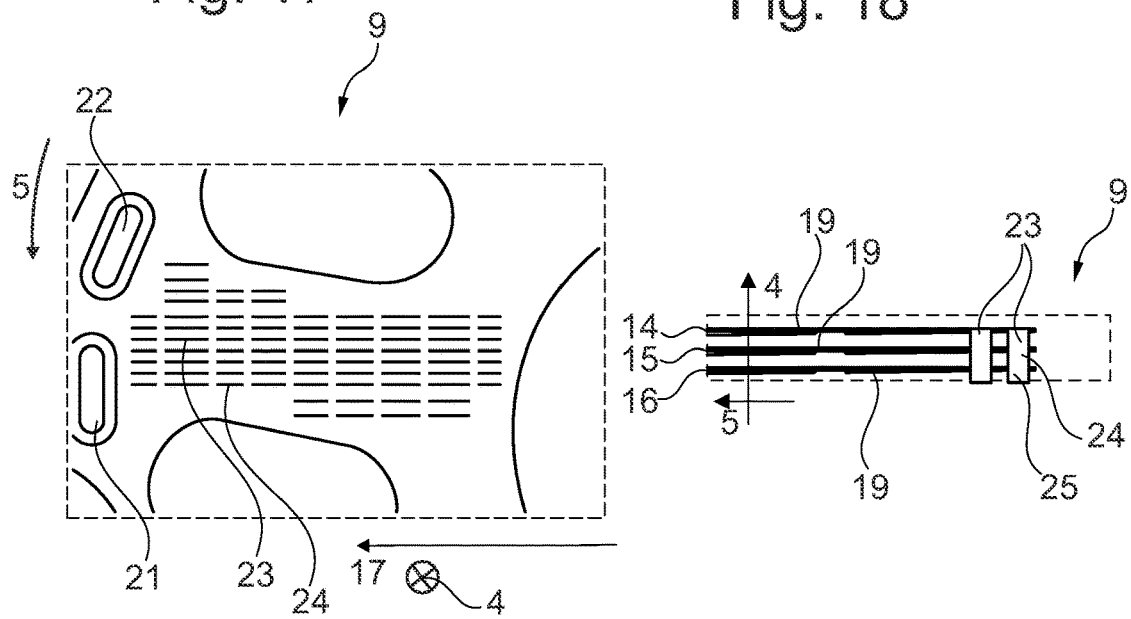
FIG. 19 shows a detail of the printed circuit board according to FIG. 9 in a plan view in section and in a side view in section.

FIG. 19 shows that the contact line 23 has a non-round line cross section 24. The contact line 23 therein has a rectangular line cross section 24. An extent of the line cross section 24 parallel to the routing of the winding 8 and the sub-line 19 is greater than an extent transverse thereto (i.e. substantially in the direction of the circumferential direction 5).

LIST OF REFERENCE SIGNS

1 Motor
2 Stator
3 Rotor
4 Axial direction
5 Circumferential direction
6 Stator tooth
7 Coil
8 Winding
9 Printed circuit board
10 End face
11 Connecting line
12 First connection
13 Second connection
14 First plane
15 Second plane
16 Third plane
17 Radial direction
18 Section
19 Sub-line
20 Width
21 First interface
22 Second interface
23 Contact line
24 Line cross section
25 Line
26 Base body
27 Magnet
28 Magnetic flux
29 First end
30 Second end
31 Routing direction

The invention claimed is:

1. An electric motor comprising a stator and an annular rotor, which are arranged adjacent to one another along an axial direction, wherein the stator has a plurality of stator teeth arranged adjacent to one another along a circumferential direction and extending in each case along the axial direction; wherein at least one coil having at least one winding is arranged on each stator tooth; wherein the at least one winding is connected to a printed circuit board in an electrically conductive manner, wherein the printed circuit board is arranged at an end face of the stator and, along the axial direction, adjacent to the stator, wherein the printed circuit board is arranged between the stator and the rotor along the axial direction, wherein the printed circuit board comprises a plurality of electric connecting lines, via which the at least one winding of each coil is connected at least to other windings or to an electrical connection of the motor; wherein these connecting lines are routed at least partly in at least one plane transverse to the axial direction in the printed circuit board; wherein each connecting line is associated with at least one electrical connection and in each case at least one stator tooth; wherein at least one section of at least one connecting line is split into a plurality of sub-lines, wherein the sub-lines in the section are arranged to be electrically insulated from one another.

2. The electric motor as claimed in claim 1, wherein the rotor has a plurality of magnets; wherein the section is arranged at least within a region of the printed circuit board with which the magnets are alignable along the axial direction during operation of the motor.

3. The electric motor as claimed in claim 1, wherein at least one sub-line extends along a routing direction between a first end and a second end, wherein the sub-line has a width of maximally 1.5 millimeters extending transversely to the routing direction and transversely to the axial direction.

4. The electric motor as claimed in claim 1, wherein the sub-lines associated with the different connecting lines are routed at least partly in mutually different planes in the printed circuit board, which planes are at least offset from one another in the axial direction.

5. The electric motor as claimed in claim 4, wherein at least the connecting lines or sub-lines arranged in mutually different planes are connected to one another in an electrically conductive manner via contact lines extending along the axial direction in the printed circuit board; wherein the contact lines have a line cross section, which is maximally 100% of a line cross section of the sub-line connected to the respective contact line.

6. The electric motor as claimed in claim 1, wherein at least some of the sub-lines in the at least one section of a connecting line are routed in mutually different planes in the printed circuit board, which planes are at least offset from one another in the axial direction.

7. The electric motor as claimed in claim 1, wherein the sub-lines are mutually connected to other sub-lines of the connecting line in an electrically conductive manner exclusively outside the section.

8. The electric motor as claimed in claim 1, wherein the connecting line is split into sub-lines along its entire extent in the printed circuit board.

9. The electric motor as claimed in claim 1, wherein each sub-line extends exclusively along a plane in the printed circuit board.

10. The electric motor as claimed in claim 1, wherein the at least one connecting line in the section is split into at least three sub-lines.

11. The electric motor as claimed in claim 1, wherein the contact line has a non-round line cross section.

12. A printed circuit board for an electric motor, wherein the motor has at least one stator and an annular rotor, which are arranged adjacent to one another along an axial direction, the stator has a plurality of stator teeth arranged adjacent to one another along a circumferential direction and extending in each case along the axial direction, at least one coil having at least one winding is arranged on each stator tooth and the at least one winding connectable to the printed circuit board in an electrically conductive manner; wherein the printed circuit board comprising a plurality of electric connecting lines via which the at least one winding of each coil is connectable at least to other windings or to at least one electrical connection of the motor; wherein these connecting lines are routed at least partly in at least one plane transverse to the axial direction in the printed circuit board; wherein each connecting line is associatable with an electrical connection and, in each case, at least one stator tooth; wherein at least one section of at least one connecting line is split into a plurality of sub-lines, wherein the sub-lines in the section are arranged to be electrically insulated from one another and wherein the printed circuit board is configured to be arranged between the stator and the rotor along the axial direction.

* * * * *